United States Patent [19]

Singh

[11] Patent Number: 6,046,944
[45] Date of Patent: Apr. 4, 2000

[54] BIAS GENERATOR CIRCUIT FOR LOW VOLTAGE APPLICATIONS

[75] Inventor: Gajendra P. Singh, Sunnyvale, Calif.

[73] Assignee: Sun Microsystems, Inc., Palo Alto, Calif.

[21] Appl. No.: 09/014,890

[22] Filed: Jan. 28, 1998

[51] Int. Cl.[7] .................................................. G11C 16/04
[52] U.S. Cl. ............................. 365/189.09; 365/189.11; 365/189.08
[58] Field of Search .............................. 365/189.09, 226, 365/189.11, 221, 189.08; 327/538

[56] References Cited

U.S. PATENT DOCUMENTS

| | | | |
|---|---|---|---|
| 5,671,179 | 9/1997 | Javanifard | 365/185.33 |
| 5,825,236 | 10/1998 | Seevinck et al. | 327/538 |
| 5,841,714 | 11/1998 | Sher et al. | 365/201 |

OTHER PUBLICATIONS

"Dynamic Dielectric Protection For I/O Circuits Fabricated in a 2.5V CMOS Technology Interfacing to a 3.3V LVTTL Bus", John Connor et al., 1997 Symposium on VLSI Circuits Digest of Technical Papers.

*Primary Examiner*—David Nelms
*Assistant Examiner*—Thong Le
*Attorney, Agent, or Firm*—Townsend and Townsend and Crew LLP

[57] ABSTRACT

A voltage bias generator circuit which uses a series of small transistors to form essentially a resistor ladder to produce a desired bias voltage at an intermediate node using the sizing of the transistors and the placement of the node. The output node is then connected to a first voltage level shifting circuit for shifting the voltage by at least 1 $V_T$. The output of the first voltage level shifting circuit is then coupled to the second voltage level shifting circuit, which shifts it back down or up to the desired bias voltage.

18 Claims, 4 Drawing Sheets

BIAS GENERATOR CIRCUIT FOR LOW VOLTAGE APPLICATIONS

BACKGROUND OF THE INVENTION

The present invention relates to bias generator circuits, and in particular to bias generator circuits for 3.3 volt or lower applications.

In order to reduce power consumption and improve clock speed, there has been a growing trend in semiconductor technology (including microprocessors, memories, and complex programmable logic devices, etc.) to design devices that have core circuitry operating at a lower power supply voltage. These circuits still must be able to interface with other circuitry which runs at higher voltage levels. For example, the core circuitry for a microprocessor may operate with a 3.3 volt or 2.9 volt voltage supply but must be able to receive signals swinging between ground and 5 volts. In newer technologies, a 1.9 volt supply for the core circuitry may be used, with an interface to the 3.3 volt external bus.

One problem that arises is that certain transistors for the interface must be provided with a 3.3 volt supply or other supplies above the 1.9 volt level. However, the transistors are limited to having a maximum of approximately 1.9 volts across them. Accordingly, there is a need for bias generator circuits at different levels to limit the excursions of the voltage of particular nodes, or to provide particular desired voltage levels using transistors that themselves do not exceed 1.9 volts (or whatever other core voltage level is used).

SUMMARY OF THE INVENTION

The present invention provides a voltage bias generator circuit which uses a series of small transistors to form essentially a resistor ladder to produce a desired bias voltage at an intermediate node using the sizing of the transistors and the placement of the node. The output node is then connected to a first voltage level shifting circuit for shifting the voltage by at least 1 $V_T$. The output of the first voltage level shifting circuit is then coupled to a second voltage level shifting circuit, which shifts it back down or up to the desired bias voltage.

At least the second voltage level shifting circuit preferably has one large transistor for setting the voltage level and one or a plurality of smaller transistors for providing leakage current to the large transistor, with the leakage current being limited to limit the DC current used. The large transistor allows a large amount of current to be driven when other circuitry attempts to vary the node from the desired bias voltage. In one embodiment, the first level shifting circuit shifts up two $V_T$ so the second level shifting circuit can use two large transistors, with the additional large transistor compensating for parasitic capacitance pulling the gate voltage down. Thus, a bias generator circuit is provided which draws very little DC current due to the small size of the transistors, but allows for a large amount of current to be driven as needed.

In one embodiment, the bias circuit can set a bias voltage level as a minimum or maximum voltage, with the output node being allowed to float either above or below the set voltage, and the large transistor providing current to offset any attempted excursion due to parasitic capacitance or other causes. Alternately, a second set of voltage level shifting circuits could be connected. The first set of voltage level shifting circuits would prevent excursions above the desired bias voltage, while the second set of voltage level shifting circuits would prevent excursions below the desired bias voltage.

In yet another embodiment, the two sets of voltage level shifting circuits could be tapped off different nodes in the transistor divider circuit to provide two different voltage levels, to set a desired voltage range. Thus, the output node could vary between the two set voltage bias levels, but could not go above the upper level or below the lower level. This type of circuit is useful for controlling nodes where the voltage cannot be allowed to go outside of a desired range in order to avoid imposing too much voltage across a transistor designed for a lower maximum voltage.

In yet another embodiment, a disable circuit is connected to the bias circuit so that the voltage bias level can either be turned on or turned off to float. Such a circuit is useful for applications where, for instance, a clamping transistor is desired to set a voltage limit at a given node in response to a first state of control signal, but is desired to release the node in response to a second state of a control signal.

For a further understanding of the nature and advantages of the invention, reference should be made to the following description taken in conjunction with the accompanying drawings.

DESCRIPTION OF THE PREFERRED EMBODIMENTS

Figure 1:
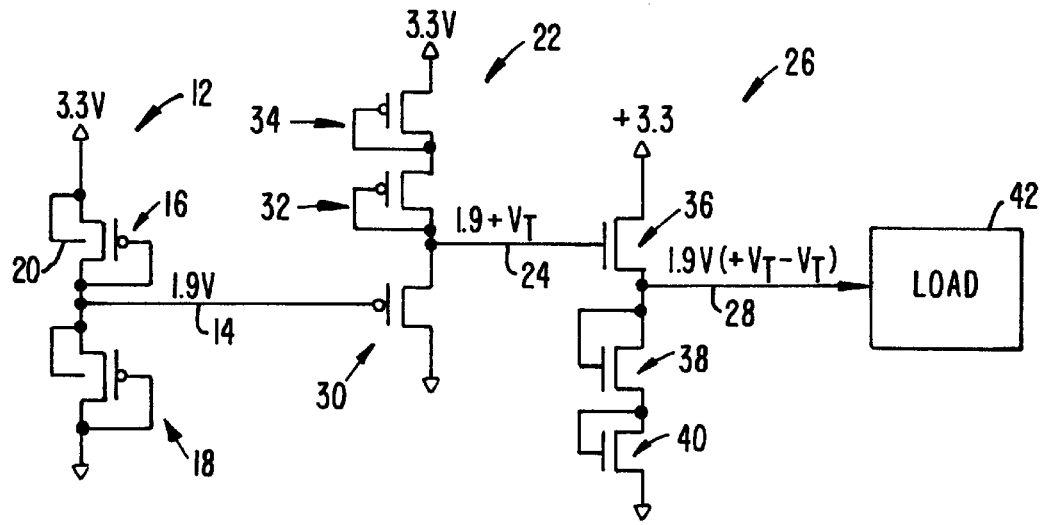
FIG. 1 is a circuit diagram of one embodiment of a voltage bias generator according to the invention, and a typical load.

FIG. 1 illustrates one embodiment of a voltage reference generator according to the present invention. An initial voltage reference circuit 12 uses transistors like a resistor divider to generate a desired bias voltage at a node 14. In the embodiment shown, 1.9 volts is generated from a 3.3 volt supply. However, other voltage supplies could be used and other levels could be generated. In addition, although two transistors 16 and 18 are used, other numbers of transistors or other types of resistive elements could be used as well. Each of transistors 16 and 18 is a pMOS transistor having its gate connected to its. drain. In addition, a node 20 illustrates the N-well of the transistor 16 which is connected to the power supply, or in the case of transistor 18, is connected to the source of the transistor. This eliminates any variations in the threshold voltage and therefore the conductivity of the transistors due to body effect.

The P-well of an nMOS transistor is normally connected to ground, and the N-well of a pMOS transistor is normally connected to the highest voltage supply. Where the source is not also connected to the same ground or highest voltage supply, the $V_T$ will be slightly different, giving the body bias effect. Normally, this is not a concern, and not worth the extra layout area needed to connect the well to the transistor's source. However, for certain critical transistors described herein, such a connection is desirable for maintaining the accuracy required.

Transistors 16 and 18 are sized to be very small to draw very little DC current. Thus, this circuit will not provide by itself needed current in the event other circuitry to which it is attached attempts to move node 14 away from its desired voltage. Thus, the present invention adds two voltage level shifting circuits that provide a buffering function. In the embodiment shown, a first voltage level shifting circuit 22 shifts the 1.9 volts up by 1 $V_T$ at a node 24, and the second shifting circuit 26 shifts the voltage back down to 1.9 volts by going down 1 $V_T$ to node 28.

In the embodiment shown in FIG. 1, voltage level shifting circuit 22 consists of a large pMOS transistor 30 and a pair of small pMOS transistors 32 and 34. Likewise, shifting circuit 26 consists of a large nMOS transistor 36, and two small nMOS transistors 38 and 40. Preferably, the big transistors 36 and 30 are designed to have at least 10 times more current driving capability than the smaller transistors, and more preferably at least 50 times more than the other transistors. In one embodiment, the big transistors have approximately 70 times the current driving capability of the other transistors.

FIG. 1 also shows an example load circuit 42 which might be connected to the desired bias voltage. In this configuration, the bias generator circuit puts a minimum level on the output node 28. Thus, the load circuit is prevented from going below the desired level. In some configurations, it may be desirable to limit the output node 28 to exactly 1.9 volts, preventing the parasitic capacitances in either direction, or other causes, from drawing the node away from the desired bias voltage.

Figure 2:
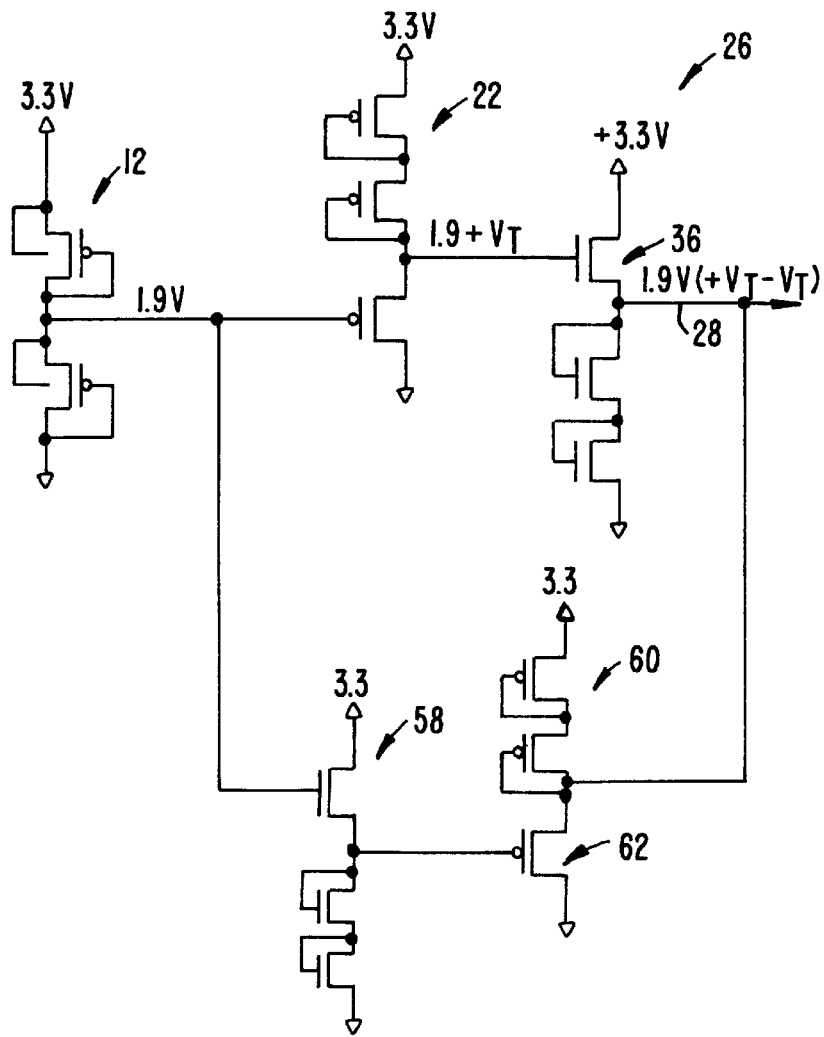
FIG. 2 is an alternate embodiment to the circuit of FIG. 1 adding a second pair of shifting circuits connected to the same node.

FIG. 2 shows an alternate embodiment of the present invention which limits voltage incursions above and below the desired voltage at output node 28. As can be seen, the circuit of FIG. 2 is identical to that of FIG. 1, except for the addition of another pair of shifting circuits, a third shifting circuit 58 and a fourth shifting circuit 60. The nMOS and pMOS configurations are reversed, so that an output pMOS transistor 62 is provided to complement nMOS transistor 36 of the circuit of FIG. 1. Thus, if node 28 attempts to go above 1.9 volts, transistor 62 turns on, drawing a large current very quickly and quickly pulling node 28 back to 1.9 volts.

As can be seen, the circuits of FIGS. 1 and 2 will draw very little DC bias current when the output node stays at the desired level. Any attempted incursion due to the parasitic capacitances, noise or otherwise, will quickly draw a large current as needed to restore the equilibrium voltage.

In some embodiments, it might be useful to shut off the bias voltage. One example of the use of such a disable circuit is set forth in copending application Ser. No. 08/880,925, entitled SIMD TCP/UDP CHECKSUMMING IN A CPU, incorporated herein by reference.

Figure 3:
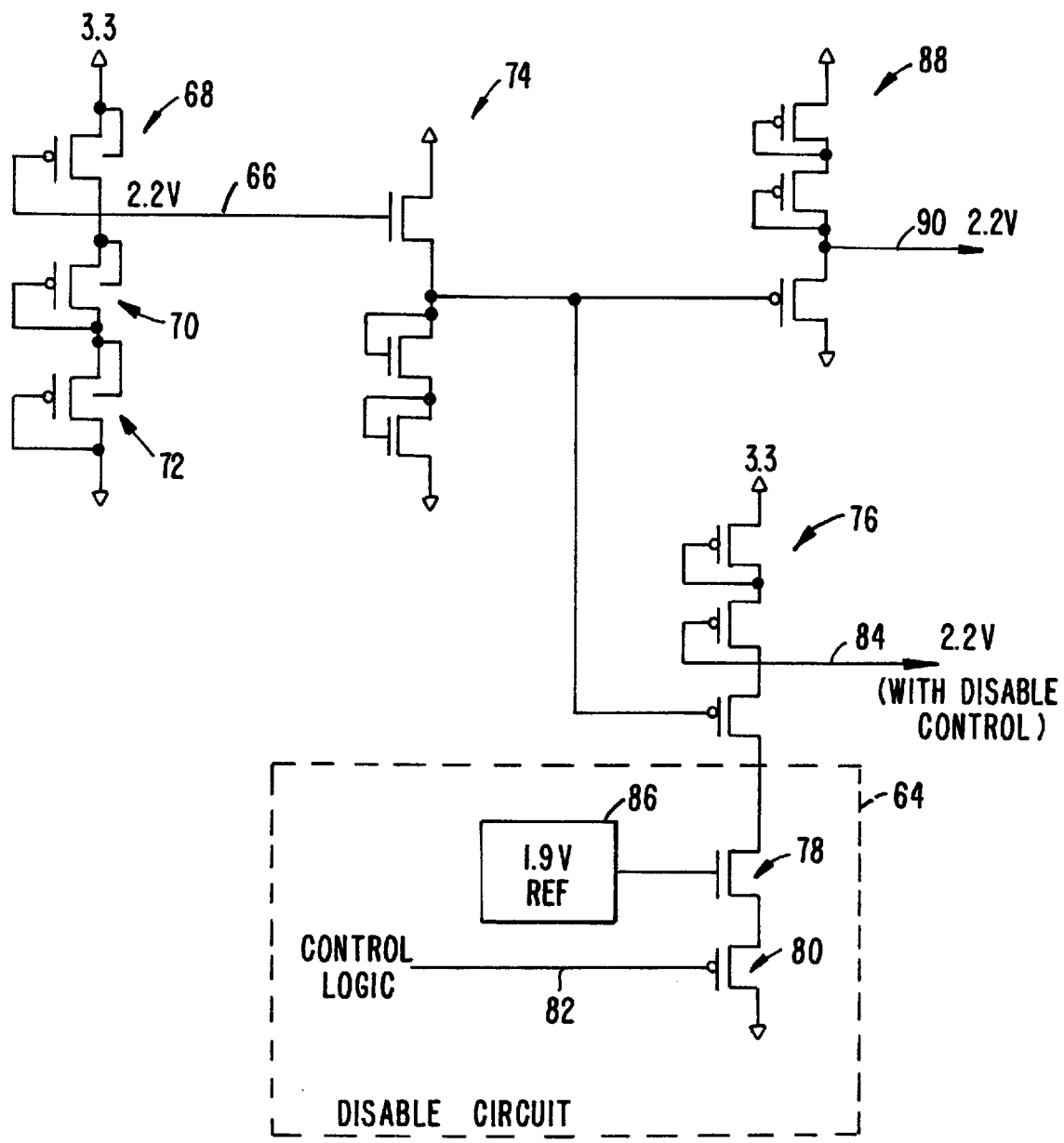
FIG. 3 is a circuit diagram of an embodiment of the invention including a disable circuit.

FIG. 3 illustrates such a disable circuit 64. In the circuit of FIG. 3, an initial voltage of 2.2 volts is generated at a node 66, in place of the 1.9 volts of FIG. 1. Here, this is done using three transistors 68, 70 and 72. Similar to the circuitry shown in FIG. 2, the 2.2 volts is shifted down by a voltage level shifting circuit 74, and then up by a voltage level shifting circuit 76. However, an additional clamping transistor 78 and a control transistor 80 are added. Control transistor 80 is connected to control logic line 82 that can turn off transistor 80, thus causing the output voltage at node 84 to float. In the example shown, clamping transistor 78 is connected to a 1.9 volt reference circuit 86, which could be constructed, for example, as shown in FIG. 2.

It may be desirable to utilize the voltage reference generated from circuit 68 and 74 for a 2.2 volt bias generator which is not turned off. In this case, another voltage level shifting circuit is added in parallel, voltage level shifting circuit 88. This produces an output at node 90 which will always stay on, while the node 84 voltage can be turned on and off as desired, depending on the application.

Figure 4:
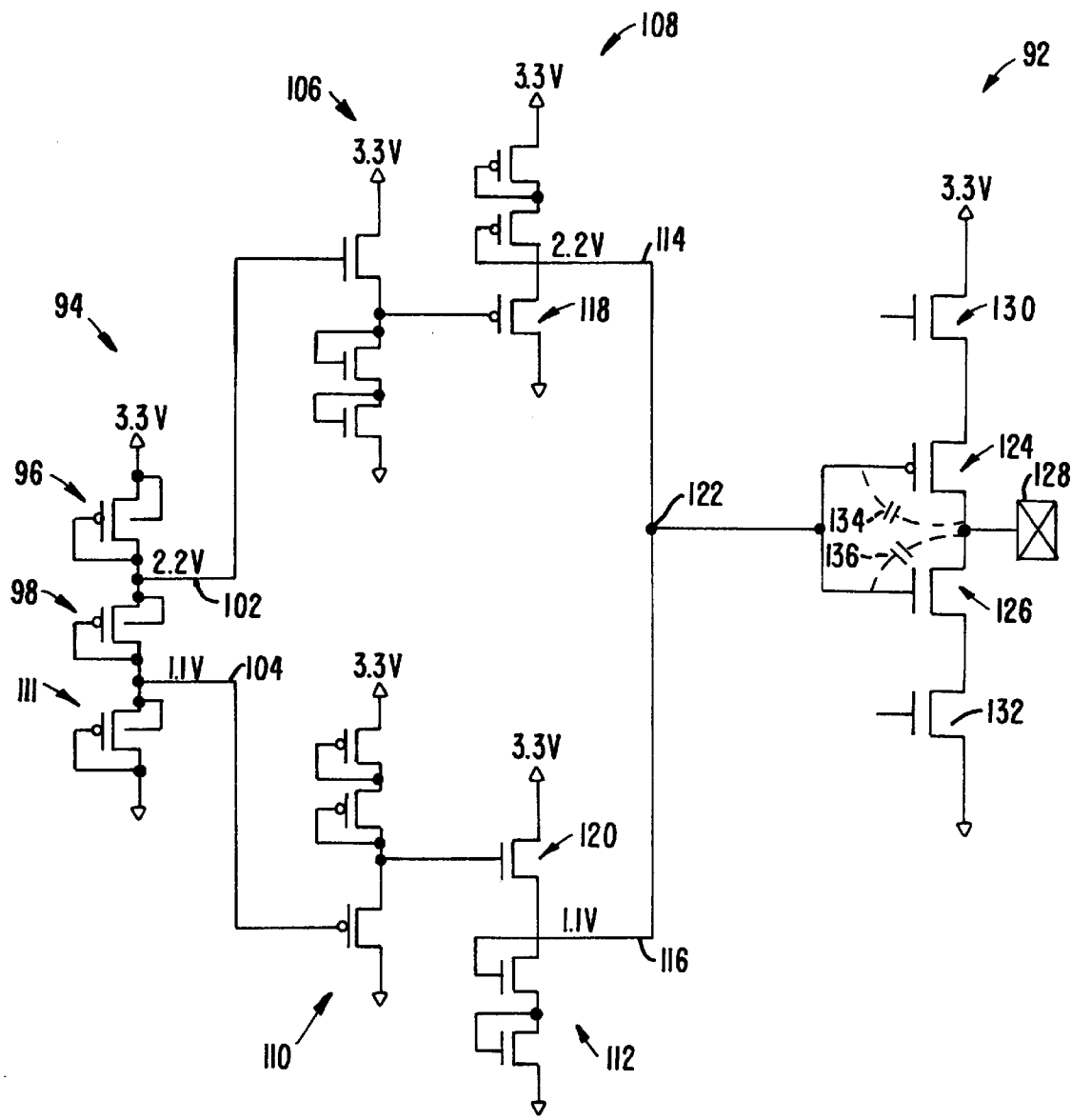
FIG. 4 is a circuit diagram of an embodiment of the present invention using two voltage bias levels for setting a desired output range.

FIG. 4 shows an alternate embodiment of the present invention which provides a voltage swing limiting circuit. In this case, instead of having the output node at a fixed level such as 1.9 volts, the output node is limited from swinging beyond a range. In the example shown, the output node is not allowed to go above 2.2 volts, or below 1.1 volts, but is allowed to vary in-between. In the example shown, this is used for driving an output buffer circuit 92 wherein the transistors need to be protected from having more than 1.9 volts across them, while the output must interface to a 3.3 volt circuit. One example of the application of this circuit is set forth in copending and commonly-assigned application Ser. No. 09/015,360, entitled "Dynamic Bias Circuit for Driving Low Voltage I/O Transistors,".

As in the previous circuits, an initial transistor divider circuit 94 using transistors 96, 98 and 100 is used to provide 2.2 volts at a node 102. However, in addition, a second node 104 is used to provide a 1.1 volt bias circuit. Similarly to the previous circuits, the 2.2 volts is first shifted down with a voltage level shifting transistor circuit 106, and then shifted up with a voltage level shifting circuit 108. Similarly, the 1.1 volt node 104 is first shifted up with a voltage level shifting circuit 110, and then shifted down with a voltage level shifting circuit 112. This provides an output 114 with a maximum value of 2.2 volts, and an output 116 with a minimum voltage of 1.1 volts.

Thus, like the circuitry described above, if node 114 attempts to go higher than 2.2 volts, pMOS transistor 118 will turn on, pulling it back to 2.2 volts. Similarly, if output 116 attempts to go lower than 1.1 volts, nMOS transistor 120 will turn on, pulling output 116 back up to 1.1 volts.

By tying outputs 114 and 116 together at a node 122, a bias voltage output is provided which can float or vary only between 1.1 and 2.2 volts. In the embodiment shown, this is connected to two output transistors 124 and 126 to allow the driving of an output pad 128 which connects to external circuitry which operates at a 3.3 volt level. The output driver includes transistors 124 and 126, as well as control transistors 130 and 132 which are responsive to the logic signal driving the output. Node 122 provides a voltage swing limiting function which avoids having more than 1.9 volts applied across any of the output transistors in circuit 92, while at the same time allowing those transistors to vary their levels to drive overshoots and undershoots upon switching voltage levels, as described in more detail in the above-referenced application Ser. No. 09/015,360. As illustrated, node 122 may be drawn up or down within the levels shown by parasitic capacitances 134 and 136.

The circuits of the present invention can also provide a safe voltage bias circuit. For example, in the 1.9 volt circuit of FIGS. 1 and 2, this is provided from a 3.3 volt circuit, even though a 1.9 volt power supply may be available on the chip for its core circuitry. However, by re-deriving the voltage level from the 3.3 volt level, this ensures that the 1.9 voltage bias generated is "safe" in the sense that it will only fail if the 3.3 volt power supply also fails. Thus, the situation of having the 1.9 volt supply fail while having the 3.3 volt supply then providing too much voltage across some transistors is avoided by deriving the 1.9 volts from the 3.3 volt supply.

In one embodiment, the large transistors of the voltage shifting circuits, such as transistors 120 and 118 of FIG. 4, have a width to length ratio (W/L) of 35 microns to 0.42, given a difference in size of approximately 70.

Figure 5:
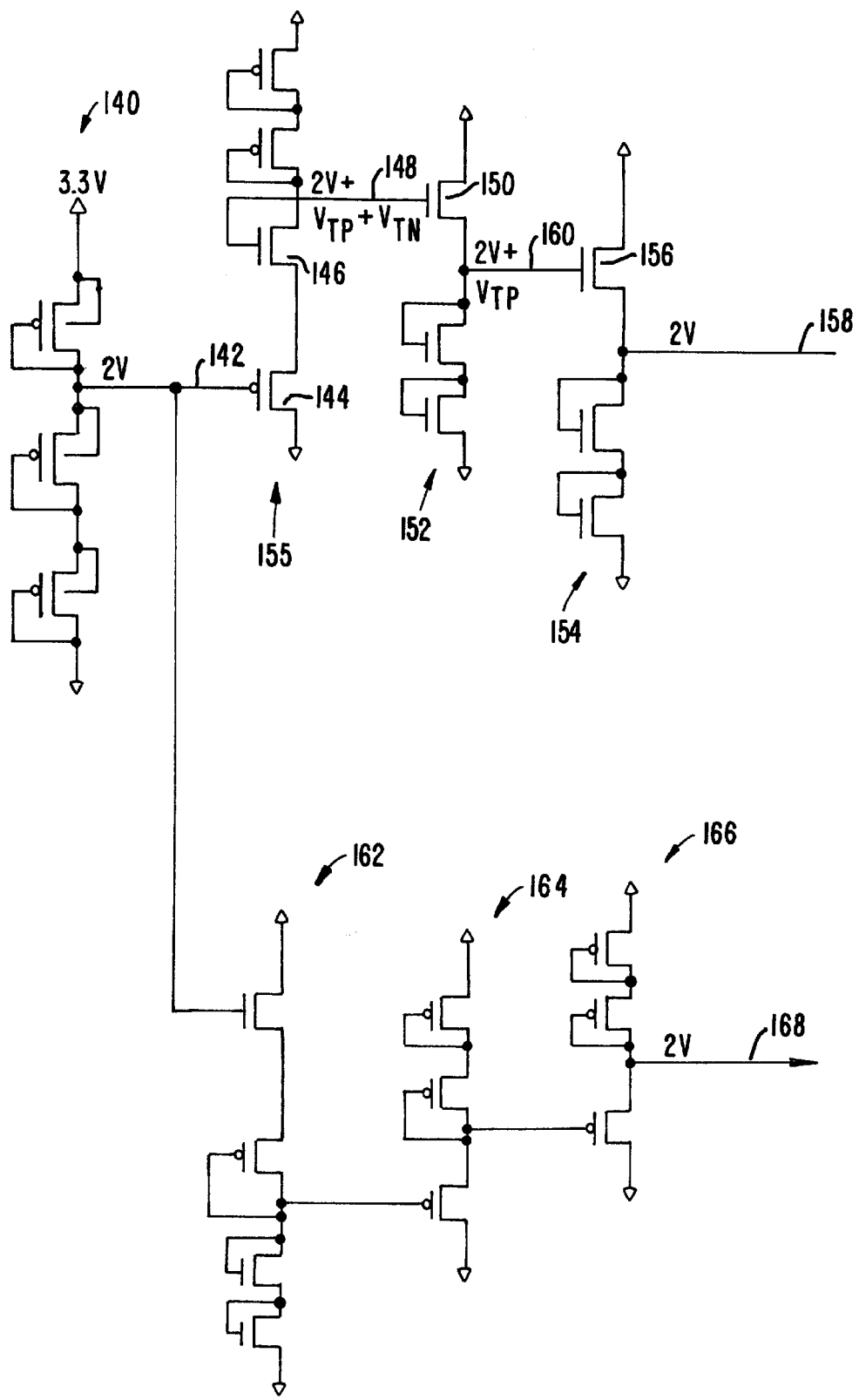
FIG. 5 is a circuit diagram of an embodiment of the invention providing for a voltage level shift of two $V_T$.

FIG. 5 shows an alternate embodiment in which the voltage level is shifted by 2 $V_T$. The reason for this can be seen by referring back to FIG. 1. There is a parasitic capacitance between the gate and source of output transistor 36, between source node 28 and gate node 24. Because pull-up pMOS transistors 32 and 34 are small and thus weak, coupling through this parasitic capacitance will tend to draw down the voltage at the gate as the voltage at node 28 falls to below the desired level for an amount of time before transistor 36 can drive node 28 back to the desired level. To minimize this effect, another big pull-up transistor is added, and thus an additional $V_T$ level shift is needed.

As shown in FIG. 5, a circuit 140 produces a 2 volt bias at a node 142. This node is connected to the gate of big pMOS transistor 144, as in the previous circuits. However, and additional nMOS transistor 146 is added, to give an additional $V_T$ shift at node 148 to 2 volts+2 $V_T$. As in previous circuits, a big transistor 150 in a voltage level shifting circuit 152 shifts down one $V_T$. Here, a second voltage level shifting circuit 154 with another big transistor 156 is added, to give the additional $V_T$ shift back to the 2 volt bias level at node 158. The combination of transistors 150 and 156 allows the circuit to quickly counteract parasitic capacitance between the gate and source of transistor 156, when it tries to pull gate node 160 down. The additional current drive provided by the additional transistor 150 will quickly bring node 160 back to its desired level, and thus node 158 back to the desired voltage level.

The transistors in voltage level shifting circuits 152, 154 and 155 do not have their wells connected to their sources to offset the body bias effect. This is because the body bias effect is offset inherently in the structure provided. The body bias effect on transistor 144 is mostly offset by the body bias effect on transistor 156. Similarly, the body bias effects of transistors 146 and 150 substantially offset. Because the first transistor is pMOS, and the second is nMOS, the $V_T$s are actually a little different, one being labelled $V_{TP}$ and the other $V_{TN}$. Any minor variation could also be compensated for by adjusting the 2 volt node value of circuit 140.

A corresponding set of level shifting circuits 162, 164 and 166 hold node 168 at the desired bias level, keeping it from being pulled high.

In a preferred embodiment, voltage reference circuits such as shown in the attached figures are reproduced at each point where they are needed on a semiconductor chip, rather than routing the same bias to various points in the chip. This has a number of advantages. First, the routing difficulties are avoided. Second, the transistor sizes can be much smaller, since they only need to drive one or a few local loads. Finally, this ensures that only the amount of current that is needed will be drawn when a particular load is turned on. Alternately, if dictated by the layout of a particular chip, it may be worth the trade off to centrally locate the circuit and then rout it to where needed.

As will be understood by those of skill in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. A voltage bias generator circuit, comprising:
   a MOS transistor divider circuit having a plurality of transistors connected between a supply voltage and a low voltage, a number and sizing of said transistors providing a first desired bias voltage at a first node;
   a first voltage level shifting circuit coupled to said first node, and configured to shift said first desired bias voltage in a first direction by a first voltage of at least one $V_T$ to a second voltage; and
   a second voltage level shifting circuit coupled to said first voltage level shifting circuit configured to shift said second voltage back to said first desired bias voltage;
   wherein each of said voltage level shifting circuits comprise:
      a first transistor coupled to an output node for providing current to said output node;
      at least one second transistor coupled to said first transistor for providing a DC current, said first transistor having at least 10 times the current drive capability of said second transistor.

2. The voltage bias generator circuit of claim 1 wherein said first transistor has at least 50 times the current drive capability of said second transistor.

3. The voltage bias generator circuit of claim 1 wherein said first and second transistors for said first voltage level shifting circuit are pMOS transistors, and for said second voltage level shifting circuit are nMOS transistors.

4. The voltage bias generator circuit of claim 1 wherein said first and second transistors for said first voltage level shifting circuit are nMOS transistors, and for said second voltage level shifting circuit are pMOS transistors.

5. A voltage bias generator circuit, comprising:
   a MOS transistor divider circuit having a plurality of transistors connected between a supply voltage and a low voltage, a number and sizing of said transistors providing a first desired bias voltage at a first node;
   a first voltage level shifting circuit, coupled to said first node, and configured to shift said first desired bias voltage in a first direction by a first voltage of at least one $V_T$ to a second voltage; and
   a second voltage level shifting circuit, coupled to said first voltage level shifting circuit, configured to shift said second voltage back to said first desired bias voltage;
   wherein said reference voltage is one of approximately 1.1, 1.9 and 2.2 volts.

6. A voltage bias generator circuit, comprising:
   a MOS transistor divider circuit having a plurality of transistors connected between a supply voltage and a low voltage, a number and sizing of said transistors providing a first desired bias voltage at a first node;
   a first voltage level shifting circuit, coupled to said first node, and configured to shift said first desired bias voltage in a first direction by a first voltage of at least one $V_T$ to a second voltage; and
   a second voltage level shifting circuit, coupled to said first voltage level shifting circuit, configured to shift said second voltage back to said first desired bias voltage;
   a third voltage level shifting circuit, coupled to said first node, and configured to shift said first desired bias voltage in said second direction by a first voltage of at least one $V_T$ to a second voltage; and
   a fourth voltage level shifting circuit, coupled to said third voltage level shifting circuit, configured to shift said first voltage back to said first desired bias voltage.

7. A voltage bias generator circuit, comprising:
   a MOS transistor divider circuit having a plurality of transistors connected between a supply voltage and a low voltage, a number and sizing of said transistors providing a first desired bias voltage at a first node;
   a first voltage level shifting circuit, coupled to said first node, and configured to shift said first desired bias voltage in a first direction by a first voltage of at least one VT to a second voltage; and a second voltage level shifting circuit, coupled to said first voltage level shifting circuit, configured to shift said second voltage back to said first desired bias voltage;

a second node in said transistor divider circuit placed to provide a second desired bias voltage;

a third voltage level shifting circuit, coupled to said second node, and configured to shift said second desired bias voltage in said second direction by a first voltage of at least one $V_T$ to a second voltage; and a fourth voltage level shifting circuit, coupled to said third voltage level shifting circuit, configured to shift said first voltage back to said second desired bias voltage.

8. The voltage bias generator circuit of claim 7 further comprising an output node tied to outputs of said second and fourth voltage level shifting circuits, said second and fourth voltage level shifting circuits being configured to allow said output node to vary only between said first and second desired bias voltages.

9. A voltage bias generator circuit, comprising:

a MOS transistor divider circuit having a plurality of transistors connected between a supply voltage and a low voltage, a number and sizing of said transistors providing a first desired bias voltage at a first node;

a first voltage level shifting circuit, coupled to said first node, and configured to shift said first desired bias voltage in a first direction by a first voltage of at least one VT to a second voltage; and a second voltage level shifting circuit, coupled to said first voltage level shifting circuit, configured to shift said second voltage back to said first desired bias voltage;

wherein said first voltage level shifting circuit shifts said first desired bias voltage by two $V_T$ to said second voltage, said second voltage level shifting circuit shifts said second voltage back to a third voltage within one $V_T$ of said first desired bias voltage and further comprising:

a third voltage level shifting circuit, coupled to said second voltage level shifting circuit, configured to shift said third voltage back to said first desired bias voltage.

10. A voltage bias generator circuit, comprising:

a MOS transistor divider circuit having a plurality of transistors connected between a supply voltage and a low voltage, a number and sizing of said transistors providing a desired bias voltage at a first node;

a first voltage level shifting circuit, coupled to said first node, and configured to shift said desired bias voltage in a first direction by a first voltage of two $V_T$ to a second voltage;

a second voltage level shifting circuit, coupled to said first voltage level shifting circuit, configured to shift said second voltage back to a third voltage within one $V_T$ of said desired bias voltage; and a third voltage level shifting circuit, coupled to said second voltage level shifting circuit, configured to shift said third voltage back to said desired bias voltage.

11. A method for generating a voltage bias, comprising the steps of:

providing a first desired bias voltage at a first node;

shifting said first desired bias voltage in a first direction by a first voltage of at least one $V_T$ to a second voltage; and shifting said second voltage back to said first desired bias voltage at a second node.

12. The method of claim 11 wherein each of said shifting steps further comprises the steps of:

providing current to an output node with a first transistor;

providing a DC current to said first transistor with a second transistor, said first transistor having at least 10 times the current drive capability of said second transistor.

13. The method of claim 12 wherein said first transistor has at least 50 times the current drive capability of said second transistor.

14. The method of claim 11 further comprising the steps of:

shifting said first desired bias voltage in said second direction by a first voltage of at least one $V_T$ to a second voltage; and shifting said first voltage back to said first desired bias voltage.

15. The method of claim 11 further comprising the steps of:

providing a second desired bias voltage at a third node;

shifting said second desired voltage bias in said second direction by a first voltage of at least one $V_T$ to a second voltage; and shifting said first voltage back to said second desired bias voltage at a fourth node.

16. The method of claim 15 further comprising the steps of:

connecting said second and fourth nodes together at an output node to allow said output node to vary only between said first and second desired bias voltages.

17. The method of claim 11 wherein said first shifting step shifts said voltage by two $V_T$, said second shifting step shifts said second voltage back to a third voltage within one $V_T$ of said first desired bias voltage and further comprising the step of:

shifting said third voltage back to said first desired bias voltage.

18. A computer system comprising:

a memory;

a bus coupled to said memory; and a logic chip coupled to said bus, said logic chip having a voltage bias generator circuit, said voltage bias generator circuit including a MOS transistor divider circuit having a plurality of transistors connected between a supply voltage and a low voltage, a number and sizing of said transistors providing a first desired bias voltage at a first node, a first voltage level shifting circuit, coupled to said first node, and configured to shift said first desired bias voltage in a first direction by a first voltage of at least one $V_T$ to a second voltage, and a second voltage level shifting circuit, coupled to said first voltage level shifting circuit, configured to shift said second voltage back to said first desired bias voltage;

wherein each of said voltage level shifting circuits comprise:

a first transistor coupled to an output node for providing current to said output node;

at least one second transistor coupled to said first transistor for providing a DC current, said first transistor having at least 10 times the current drive capability of said second transistor.

* * * * *